US006809611B2

(12) United States Patent
Ishizaki et al.

(10) Patent No.: US 6,809,611 B2
(45) Date of Patent: Oct. 26, 2004

(54) COMPOSITE FILTER, ANTENNA DUPLEXER, AND COMMUNICATION APPARATUS

(75) Inventors: Toshio Ishizaki, Kobe (JP); Hiroyuki Nakamura, Katano (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/264,986

(22) Filed: Oct. 1, 2002

(65) Prior Publication Data

US 2003/0076195 A1 Apr. 24, 2003

(30) Foreign Application Priority Data

Oct. 1, 2001 (JP) ....................................... 2001-304823

(51) Int. Cl.[7] ............................ H03H 9/64; H03H 9/72; H01P 1/20

(52) U.S. Cl. ....................... 333/133; 333/193; 333/202; 333/206

(58) Field of Search ................................ 333/193–196, 333/133, 202, 206

(56) References Cited

U.S. PATENT DOCUMENTS 4,295,108 A * 10/1981 Ieki ............................ 333/193
5,386,203 A 1/1995 Ishihara
5,815,052 A * 9/1998 Nakajima et al. ........... 333/175
5,894,251 A * 4/1999 Taguchi et al. ............ 333/193
6,201,457 B1 3/2001 Hickernell

FOREIGN PATENT DOCUMENTS

| | | | |
|---|---|---|---|
| EP | 0 959 567 A | 11/1999 | |
| EP | 1 014 592 A | 6/2000 | |
| EP | 1 089 449 A | 4/2001 | |
| JP | 4-196829 | * 7/1992 | |
| JP | 5-175879 | * 7/1993 | ................. 455/286 |
| JP | 06-350307 | 12/1994 | |
| JP | 7-15276 | * 1/1995 | ................. 333/193 |
| JP | 9-83214 | 3/1997 | |
| JP | 10-041704 | 2/1998 | |

OTHER PUBLICATIONS

European Search Report for Application No. EP 02 02 2211, Nov. 17, 2003.

* cited by examiner

*Primary Examiner*—Barbara Summons
(74) *Attorney, Agent, or Firm*—RatnerPrestia

(57) ABSTRACT

A composite filter has a dielectric notch filter; and a first surface acoustic wave filter. An attenuation band of the dielectric notch filter and an attenuation band of the first surface acoustic wave filter have at least a common band portion; and the dielectric notch filter and the surface acoustic wave filter are connected in cascade.

9 Claims, 9 Drawing Sheets

COMPOSITE FILTER, ANTENNA DUPLEXER, AND COMMUNICATION APPARATUS

BACKGROUND OF THE INVENTION

1. Field of the Invention

The present invention relates to a composite filter used for a communication apparatus such as a portable phone terminal, an antenna duplexer, and a communication apparatus.

2. Related Art of the Invention

A filter is usually used for a communication apparatus such as a portable phone terminal. There is a multi-input/single-output filter, which receives a plurality of signals and outputs one signal, as one of such filters.

FIG. 7 shows the structure of a portable phone terminal 60. A conventional multi-input/single-output filter like this is used for the portable phone terminal 60. The portable phone terminal 60 is a dual band terminal, which can perform radiocommunication, by using either of two frequency bands of a 1.5-GHz frequency band and an 800-MHz band.

FIG. 2 shows the frequency composition of the 800-MHz band that the portable phone terminal 60 uses.

A D band 23 and a D band 28 are frequency bands used in a communication system where the portable phone terminal 60 performs transmission and reception simultaneously. The D band 23 is a band used for reception in the portable phone terminal 60, and the D band 28 is a band used for transmission in the portable phone terminal 60.

An A-band 25 and an A-band 27 are frequency bands used in a communication system different from the above-described system. The A-band 25 is a band used for reception in a portable phone terminal, and the A-band 27 is a band used for transmission in the portable phone terminal. The communication system that uses the A-band 25 and A-band 27 is a communication system not performing the simultaneous transmission and reception. A C band 24 and a C band 26 are frequency bands used in a communication system the same as the above-described communication system. The C band 24 is a band used for reception in the portable phone terminal 60, and the C band 26 is a band used for transmission in the portable phone terminal 60. The communication system that uses the C band 24 and C band 26 is a communication system not performing the simultaneous transmission and reception the same as the above. The portable phone terminal 60 can use each communication system corresponding to the D band, A-band, or C band by switching the bands according to a region such as a country where the portable phone terminal 60 is used. Specifically, a communication system that uses the D band is, for example, a PDC full duplex system. A communication system that uses the A-band is, for example, a usual time-sharing PDC system, and a communication system that uses the C band is also, for example, a usual timesharing PDC system. In addition, it is needless to say that any communication system besides this is sufficient so long as the communication system that uses the D band is a communication system performing the transmission and reception simultaneously and the communication system that uses the A-band and C band is a communication system not performing the transmission and reception simultaneously.

The portable phone terminal 60 comprises a transmitting circuit section 1, a receiving circuit section 2, a base band section 3, a switch 4, an antenna 5, an antenna 6, a 1.5-GHz band SAW filter 17, and, a composite filter 33.

The base band section 3 is a circuit that modulates a base band signal, outputs the modulated signal as an intermediate frequency signal to the transmitting circuit section 1, and demodulates the intermediate frequency signal inputted from the receiving circuit section 2 to output a sound signal. In addition, the base band section 3 contains a frequency converter that converts the base band signal into the intermediate frequency signal and converts the intermediate frequency signal into the base band signal.

The transmitting circuit section 1 is a circuit that outputs either a 1.5-MHz band transmitted-signal or an 800-MHz band transmitted-signal. In addition, the switching of which of the 1.5-GHz band transmitted signal and the 800-MHz band transmitted-signal are outputted is performed by a controlling circuit not shown.

The transmitting circuit section 1 comprises an upconverter 7*a*, a variable gain amplifier 81*a*, a filter 8*a*, a power amplifier 9*a*, a coupling capacitor 10, an isolator 11, a filter 12, an upconverter 7*b*, a variable gain amplifier 81*b*, a filter 8*b*, a power amplifier 9*b*, and a directional coupler 13.

The upconverter 7*a* is means of converting the intermediate frequency signal outputted from the base band section 3 into the 800-MHz band signal. The variable gain amplifier 81*a* is an amplifier whose gain is controlled by a controlling circuit not shown, and which amplifies the 800-MHz band signal, which is converted, in such a gain that the 800-MHz band signal may become a determined transmission power output. The filter 8*a* is a band-pass filter decreasing an unnecessary frequency component of the 800-MHz band signal outputted from the upconverter 7*a*. The power amplifier 9*a* is means of amplifying the signal outputted from filter 8*a* to a transmission output. The coupling capacitor 10 supplies a power monitor signal to adjust the output power of the power amplifier 9*a*. The isolator 11 passing the transmitted signal, outputted by the power amplifier 9*a*, to the filter 12, and interrupting the transmitted signal reflected from the filter 12. The filter 12 decreasing an unnecessary frequency component of the signal outputted from the isolator 11.

The upconverter 7*b* converts the intermediate frequency signal, outputted from the base band section 3, into a 1.5-GHz band signal. The variable gain amplifier 81*b* is an amplifier whose gain is controlled by a controlling circuit not shown, and which amplifies the 1.5-GHz band signal, which is converted, in such a gain that the 1.5-GHz band signal may become a determined transmission power output. The filter 8*b* decreases an unnecessary frequency component of the 1.5-GHz band signal outputted from the upconverter 7*b*. The power amplifier 9*b* amplifies the signal outputted from the filter 8*b* to a transmission output. The directional coupler 13 passes the signal, outputted from the power amplifier 9*b*, to the switch 4 and not passing a reflected wave from the switch 4 to the power amplifier 9*b*, and supplies a power monitor signal to a controlling circuit that adjusts the output power of the power amplifier 9*b* and is not shown.

The receiving circuit section 2 converts the signal, inputted from the composite filter 33, into the intermediate frequency signal to output the signal to the base band section 3.

The receiving circuit section 2 comprises a low-noise amplifier 19*a*, a filter 20*a*, a mixer 21*a*, a low-noise amplifier 19*b*, a filter 20*b*, a mixer 21*b*, and a filter 22.

The low-noise amplifier 19*a* amplifies the 800-MHz band signal received. The filter 20*a* decreases an unnecessary frequency component of the signal amplified by the low-noise amplifier 19*a*. The mixer 21*a* is a signal, which passed the filter 20*a*, into the intermediate frequency signal.

The low-noise amplifier 19*b* amplifies the 1.5-GHz band signal received. The filter 20*b* decreases an unnecessary frequency component of the signal amplified by the low-noise amplifier 19*b*. The mixer 21*b* converts a signal, which passed the filter 20*b*, into the intermediate frequency signal.

Moreover, the filter 22 decreases an unnecessary frequency component included in the signal converted into the intermediate frequency.

The 1.5-GHz-band-receiving SAW filter 17 is a surface acoustic wave filter that passes the 1.5-GHz band signal received, and attenuates a signal except the 1.5-GHz band that is used for reception.

The composite filter 33 is a multi-input/single-output filter having a plurality of inputs and one output.

The composite filter 33 comprises a dielectric filter 30, an A-band-receiving SAW filter 31, and a switch 32.

The dielectric filter 30 is a dielectric coaxial filter that passes a signal in the D band 23, and attenuates a signal in the D band 28.

The A-band-receiving SAW filter 31 is a surface acoustic wave filter that passes a signal in the A-band 25.

The switch 32 switches which of an output of the A-band-receiving SAW filter 31. And output of the dielectric filter 30 is outputted to the receiving circuit section 2, and matching impedance with the receiving circuit section 2.

The switch 4 switches inputs of the composite filter 33 which receives a signal received by the antennas 5 and 6, and switches outputs of the transmitting circuit section 1 is inputted into the antennas 5 and 6.

The operation at the time of the portable phone terminal 60 communicating by a communication system using the D band 23 and D band 28 will be explained.

In this case, the portable phone terminal 60 performs simultaneous transmission and reception that the portable phone terminal 60 transmits a transmitted wave and receives a received wave at the same time.

That is, the intermediate frequency signal outputted from the base band section 3 is inputted into the upconverter 7*a* of the transmitting circuit section 1. The upconverter 7*a* converts the inputted intermediate frequency signal into a transmission frequency signal, that is, a signal at a frequency included in the D band 28. This transmission frequency signal is amplified in such a gain that the transmission frequency signal may become a transmission output determined by the variable gain amplifier 81*a*, is decreased by the filter 8*a* for its unnecessary frequency component, and is amplified to a transmission output by the power amplifier 9*a*. The amplified signal passes the isolator 11, is decreased by the filter 12 for a strain component, and is inputted to the switch 4. The switch 4 is switched so that an output signal of the filter 12 may be inputted into the antenna 5 or 6. Hence, the signal outputted from the filter 12 is inputted into the antenna 5 or antenna 6, and is radiated as an electric wave from the antenna 5 or antenna 6 in the air.

On the other hand, at the same time as the above-described transmitting operation, the electric wave transmitted from a base station is converted into an electrical signal by the antenna 5 or antenna 6, and is outputted into the switch 4. The switch 4 switches under the control of a controlling circuit, not shown, which of the 1.5-GHz band SAW filter 17, A-band-receiving SAW filter 31, and dielectric filter 30 receives the electrical signal outputted from the antenna 5 or antenna 6. Now, since this system communicates by the communication system using the D band 23 and D band 28, the switch 4 is switched so that this electrical signal may be outputted as a received signal to the dielectric filter 30. Hence, the received signal is outputted to the dielectric filter 30.

Moreover, since simultaneous transmission and reception are performed, the transmitted signal outputted from the transmitting circuit section 1 is outputted to the antennas 5 and 6 via the switch 4 and is radiated in the air, and simultaneously, a part of the transmitted signal is inputted from the switch 4 to the dielectric filter 30. This transmitted signal is high-power in comparison with the received signal. Hence, the dielectric filter 30 that is strong in a large amount of power is used instead of a SAW filter as a filter for the D band 23. The dielectric filter 30 attenuates the transmitted signal included in the D band 28, and passes the received signal included in the D band 23.

The switch 32 is switched by a controlling circuit, not shown, so as to output an output signal from the dielectric filter 33 to the low-noise amplifier 19*a*. The switch 32 selectively switches an output signal from the dielectric filter 30, and makes the output signal inputted into the low-noise amplifier 19*a*.

The low-noise amplifier 19*a* amplifies the signal inputted from the switch 32. The amplified signal is decreased as an unnecessary frequency component by the filter 20*a*, and is converted into an intermediate frequency signal by the mixer 21*a*. The filter 22 decreases an unnecessary frequency component included in the signal converted into the intermediate frequency to output the signal to the base band section 3.

Next, the operation at the time of the portable phone terminal 60 communicating by a communication system using the A-band 25 and A-band 27 will be explained.

In this case, when the portable phone terminal 60 outputs a transmitted wave, the receiving circuit 2 does not output the intermediate frequency signal to the base band section 3. That is, the receiving operation is stopped. Then, when the receiving circuit 2 inputs the received signal and converts the signal into an intermediate frequency signal to output the signal to the base band section 3, the transmitting circuit 1 does not output the transmitted signal. In this manner, the portable phone terminal 60 switches the transmitting and receiving operation in time-sharing.

That is, when the transmitting operation is performed, the transmitting circuit section 1 outputs the transmitted signal to the switch 4 similarly to the case of the above-mentioned D band. The switch 4 is switched under the control of a controlling circuit, not shown, so that the inputted signal may be inputted to the antenna 5 or antenna 6. Hence, the signal inputted from the transmitting circuit section 1 to the switch 4 is radiated from the antenna 5 or antenna 6 as an electric wave in the air.

Moreover, at the time of receiving operation, the switch 4 is switched by a controlling circuit, not shown, so that a received signal converted into an electrical signal by the antenna 5 or antenna 6 may be inputted into the A-band-receiving SAW filter 15. Hence, the received signal that is converted into the electrical signal by the antenna 5 or antenna 6 is inputted into the A-band-receiving SAW filter 31 through the switch 4. In this case, since the transmitting circuit section 1 stops its operation, that is, does not output a transmitted signal, the transmitted signal is not inputted into the A-band-receiving SAW filter 31. The A-band-receiving SAW filter 31 passes a received signal in the A-band 25, and attenuates a signal, having a frequency except the A-band 25, as a noise component.

Moreover, the switch 32 is selectively switched by the controlling circuit, not shown, so that a signal outputted from the A-band-receiving SAW filter 31 may be inputted into the low-noise amplifier 19*a*. Hence, the signal having passed the A-band-receiving SAW filter 31 is inputted into the low-noise amplifier 19*a*. At this time, the switch 32 matches an output impedance of the A-band-receiving SAW filter 31 with an input impedance of the low-noise amplifier 19*a*.

The signal inputted into the low-noise amplifier 19*a* is converted into an intermediate frequency signal by the receiving circuit section 2 similarly to the case of the communication system that uses the D band 23 and D band 28, and is outputted to the base band section 3.

Next, the operation of the case that the portable phone terminal 60 communicates by the communication system that uses the 1.5-GHz band will be explained.

In this case, similarly to the communication system that uses the A-band 25 and A-band 27, the portable phone terminal 60 switches the transmitting and receiving operation in time-sharing.

At the time of transmission, the intermediate frequency signal outputted from the base band section 3 is inputted into the upconverter 7*b* of the transmitting circuit section 1, and is converted into a transmission frequency signal in the 1.5-GHz band by the upconverter 7*b*. The signal outputted from the upconverter 7*b* is amplified in such a gain that the signal may become a transmission output determined by the variable gain amplifier 81*b*, is decreased by the filter 8*b* for its unnecessary frequency component, is amplified to a transmission output by the power amplifier 9*b*, and is outputted to the switch 4 through the directional coupler 13.

The switch 4 is switched under the control of a controlling circuit, not shown, so that the output from the directional coupler 13 may be inputted into the antenna 5 or antenna 6. Hence, the transmitted signal outputted from the directional coupler 13 is inputted into the antenna 5 or antenna 6 through the switch 4, and is radiated as an electric wave from the antenna 5 or antenna 6 in the air.

In addition, at the time of reception, the received signal that is converted into the electrical signal by the antenna 5 or antenna 6 is inputted into the switch 4. The switch 4 is switched by a controlling circuit not shown so that the received signal received by the antenna 5 or antenna 6 may be inputted into the 1.5-GHz band SAW filter 17. Hence, the received signal that is outputted from the antenna 5 or antenna 6 is inputted into the 1.5-MHz band SAW filter through the switch 4. The 1.5-GHz band SAW filter 17 outputs the received signal to the low-noise amplifier 19*b* of the receiving circuit section 2 with decreasing an unnecessary frequency component. The low-noise amplifier 19*b* amplifies the inputted signal, the amplified signal that is inputted into the mixer 21*b* with being decreased for its unnecessary frequency component by the filter 20*b*. The mixer 21*b* converts the inputted signal into an intermediate frequency signal, and after being decreased by the filter 22 for its unnecessary frequency component, the intermediate frequency signal is outputted to the base band section 3.

In this manner, in regard to the composite filter 33, a dielectric filter that can endure also the high-power input is used as a filter for the D band 23 that performs simultaneous transmission and reception. In addition, a SAW filter with small size is used as a filter for the A-band 25 that does not perform simultaneous transmission and reception.

Moreover, a single-input/single-output filter is used also in another circuit portion of the portable phone terminal 60. As such a filter, it is possible to miniaturize the filter by using a SAW filter when a low-power signal is inputted, and a dielectric filter is used when a large attenuation is necessary.

Nevertheless, in general, a dielectric filter has a feature that an attenuation characteristic is not steep in the vicinity of a pass band in comparison with a SAW filter. Hence, though having a large attenuation in the D band 28, the dielectric filter 30 cannot have a large attenuation as much as expected in the A-band 25 whose frequency is more adjacent to the D band 23.

Hence, if a signal, formed by directly connecting an output of the A-band-receiving SAW filter 31 to an output of the dielectric filter 30 without the switch 32, is made an input into the low-noise amplifier 19, it is not possible to synthesize the outputs of the dielectric filter 30 and A-band-receiving SAW filter 31. That is, an output signal from the A-band-receiving SAW filter 31 passes from an output terminal of the dielectric filter 30 to an input terminal.

In this manner, since it is not possible to make the output impedance of the dielectric filter 30 infinite (open) in a frequency of a pass band of the A-band-receiving SAW filter 31, it is not possible to synthesize the outputs of the dielectric filter 30 and A-band-receiving SAW filter 31 if the switch 32 is not provided.

That is, in the conventional composite filter 33, so as to synthesize the outputs of the dielectric filter 30 and SAW filter 31, the switch 32 is needed.

In this manner, in the conventional composite filter 33, since it is necessary to use the switch 32 so as to synthesize the outputs, its size becomes larger for that. Moreover, the loss of the composite filter 33 becomes large due to the loss at the time of a signal passing the switch 33.

That is, a conventional composite filter has an problem that its size becomes large since it is necessary to use a switch for synthesizing outputs.

Moreover, the conventional composite filter has an issue that its loss becomes large since needing to use a switch so as to synthesize outputs.

In addition, as described above, the dielectric filter has an attenuation characteristic that is not steep in the vicinity of a pass band in comparison with a SAW filter. Hence, though the dielectric filter 33 can attenuate a high-power transmitted signal included in the D band 28, it involuntarily passes a noise component in the vicinity of the D band 23. Moreover, since the dielectric filter 33 needs to attenuate the high-power transmitted signal included in the D band 28 enough, it is necessary to use the dielectric filter 33 with a large attenuation. Therefore, the dielectric filter 33 is enlarged. Moreover, on the contrary, if the dielectric filter 33 that is small is used, an attenuation is insufficient, and hence, it becomes not possible to attenuate the high-power transmitted signal included in the d band 28 enough.

That is, a conventional composite filter has a problem in obtaining excellent filter characteristic with small in size and, in order to obtain excellent filter characteristics the composite filter is required to be large in size.

Moreover, there is a problem that, though an attenuation is large in size when an dielectric filter is used as a single-input/single-output filter, it is not possible to obtain a steep characteristic in the vicinity of a pass band.

Moreover, there is a problem that, though it is possible to obtain a steep attenuation characteristic in the vicinity of a pass band when a SAW filter is used as a single-input/single-output filter, it is not possible to obtain a large magnitude attenuation.

SUMMARY OF THE INVENTION

In consideration of the above-mentioned issues, the present invention aims at providing a composite filter, an antenna duplexer, and an communication apparatus that are small.

In addition, in consideration of the above-mentioned problems, the present invention aims at providing a composite filter, an antenna duplexer, and an communication apparatus that have low loss in a pass band.

Furthermore, in consideration of the above-mentioned problems, the present invention aims at providing a composite filter, an antenna duplexer, and an communication apparatus that each have a high attenuation in a pass band.

Moreover, in consideration of the above-mentioned problems, the present invention aims at providing a composite filter an attenuation of which is large even if a high-power signal is inputted, and which has a steep attenuation characteristic in the vicinity of a pass band.

In consideration of the above-mentioned problems, the present invention aims at providing a composite filter, an antenna duplexer, and an communication apparatus that each steeply attenuate a signal in the vicinity of a pass band and have a large attenuation.

One aspect of the present invention is a composite filter comprising:

a dielectric notch filter; and a first surface acoustic wave filter, wherein an attenuation band of the dielectric notch filter and an attenuation band of the first surface acoustic wave filter have at least a common band portion; and wherein the dielectric substance notch filter and the surface acoustic wave filter are connected cascade.

Another aspect of the present invention is the composite filter, wherein an attenuation frequency of the dielectric notch filter and an attenuation frequency of the first surface acoustic wave filter coincide substantially.

Still another aspect of the present invention is the composite filter, wherein an input signal is inputted into a terminal of the dielectric notch filter;

wherein another terminal of the dielectric notch filter is connected to a terminal of the first surface acoustic wave filter; and wherein an output signal is outputted from another terminal of the first surface acoustic wave filter.

Yet still another aspect of the present invention is the composite filter, comprising:

a second surface acoustic wave filter one terminal of which receives an input signal, and another terminal of which is connected to another terminal of the first surface acoustic wave filter, wherein a terminal of the dielectric notch filter receives a signal in a first frequency band and a signal in a third frequency band that is a frequency band not including a common portion to the first frequency band;

wherein a terminal of the second surface acoustic wave filter receives a signal in a second frequency band that is a frequency band not having a common portion to the first frequency band and the third frequency band, and is a frequency band between the first frequency band and the third frequency band;

wherein both of a pass band of the dielectric notch filter and a pass band of the first surface acoustic wave filter include the first frequency band, wherein a pass band of the second surface acoustic wave filter includes the second frequency band;

wherein both of an attenuation band of the dielectric notch filter and an attenuation band of the first surface acoustic wave filter include the third frequency band;

wherein a frequency interval between a frequency included in the first frequency band and a frequency included in the third frequency band is apart equally to or more than a predetermined frequency interval; and wherein the first surface acoustic wave filter can block at least a signal in the second frequency band.

Still yet another aspect of the present invention is the composite filter, wherein the second surface acoustic wave filter can block at least a signal in the first frequency band.

A further aspect of the present invention is the composite filter, comprising:

at least a third filter one terminal of which receives an input signal, and another terminal of which is connected to another terminal of the first surface acoustic wave filter;

wherein a signal in frequency bands that do not have common portions to the first frequency band and the third frequency band and do not have common portions to each other is inputted into one terminal of the third surface acoustic wave filter;

Wherein a pass band of the third surface acoustic wave filter includes a frequency band including the signal inputted; and wherein the third surface acoustic wave filter can block at least a signal in the first frequency band, a signal in the second frequency band, and a signal inputted to a third surface acoustic wave filter that is not itself.

A still further aspect of the present invention is the composite filter, wherein an attenuation frequency of the dielectric notch filter is adjusted so as to obtain an attenuation equal to or more than a predetermined amount by combining an attenuation of the dielectric notch filter with an attenuation of the first surface acoustic wave filter.

A yet further aspect of the present invention is the composite filter, wherein which of one terminal of the dielectric notch filter and the surface acoustic wave filter receives a signal is switched by a switch.

A still yet further aspect of the present invention is an antenna duplexer comprising:

the composite filter;

a transmission filter connected to the switch, wherein the first frequency band is a frequency band for reception when simultaneous transmission and reception is performed;

wherein the third frequency band is a frequency band for communication when the simultaneous transmission and reception is performed; and wherein the switch not only electrically connects the antenna to one terminal of the dielectric notch filter, but also electrically connects an output of the transmission filter to the antenna when the simultaneous transmission and reception is performed.

An additional aspect of the present invention is a communication apparatus comprising:

the antenna duplexer;

a transmitting circuit outputting a transmitted signal to the transmission filter; and a receiving circuit receiving a received signal outputted from the composite filter of the antenna duplexer.

DESCRIPTION OF SYMBOLS

Figure 1:
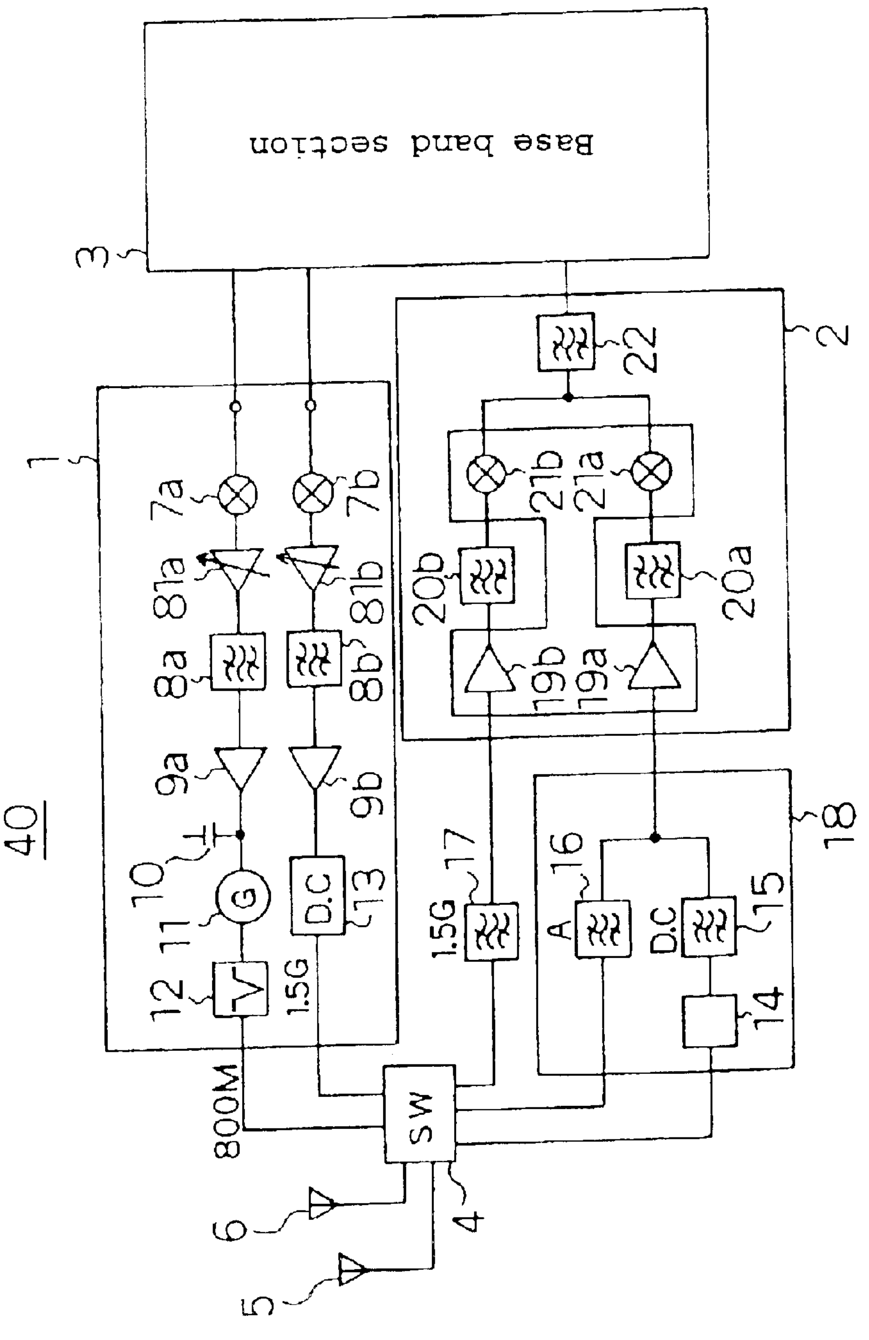
FIG. 1 is a block diagram showing the configuration of a portable phone terminal using a composite filter according to a first embodiment of the present invention.

1 Transmitting circuit section
2 Receiving circuit section
3 Base band section
4 Switch
5, 6 Antennas
7*a*, 7*b* Upconverters
8*a*, 8*b* Filters
9*a*, 9*b* Power amplifiers
10 Coupling capacitor
11 Isolator
12 Filter
13 Directional coupler
14 Dielectric notch filter
15 D-band-receiving SAW filter
16 A-band-receiving SAW filter
17 1.5-GHz band SAW filter
18 Composite filter
19*a*, 19*b* Low noise amplifiers
20*a*, 20*b* Filters
21*a*, 21*b* Mixers
22 Filter
81*a*, 81*b* Variable gain amplifiers

PREFERRED EMBODIMENTS OF THE INVENTION

Hereafter, embodiments of the present invention will be explained with referring to drawings.

Embodiment 1

FIG. 1 shows the configuration of a portable phone terminal 40 according to a first embodiment. A dual-input/single-output composite filter is used for the portable phone terminal 40, and the portable phone terminal 40 is a dual band device that can perform radiocommunication by using two frequency bands, that is, a 1.5-GHz band and a 800-MHz band.

Figure 2:
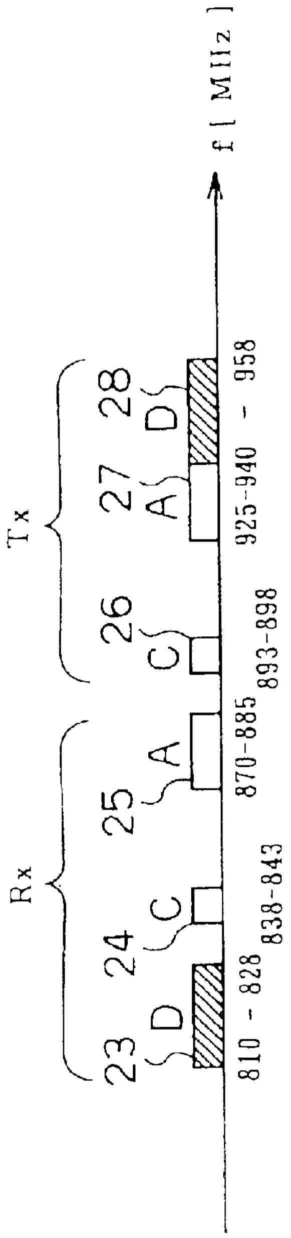
FIG. 2 is a diagram showing frequency bands in an 800-MHz band used when the portable phone terminal and a conventional portable phone terminal in the first embodiment of the present invention communicate.

FIG. 2 shows the frequency composition of the 800-MHz band that the portable phone terminal 40 uses. In addition, since these frequency bands and communication system are the same as those explained in section "Prior art", detailed explanation of them will be omitted.

Furthermore, unless specified, the detailed explanation will be omitted with assigning the same reference symbols to parts that are the same as those in section "Prior art".

The portable phone terminal 40 comprises a transmitting circuit section 1, a receiving circuit section 2, a base band section 3, a switch 4, an antenna 5, an antenna 6, a 1.5-GHz band SAW filter, and a composite filter 18.

The base band section 3 is a circuit that modulates a base band signal, outputs the modulated signal as an intermediate frequency signal to the transmitting circuit section 1, and demodulates the intermediate frequency signal inputted from the receiving circuit section 2 to output a sound signal. In addition, the base band section 3 contains a frequency converter that converts the base band signal into the intermediate frequency signal and converts the intermediate frequency signal into the base band signal.

The transmitting circuit section 1 is a circuit that outputs either a 1.5-MHz band transmitted signal or an 800-MHz band transmitted signal. In addition, the switching of which of the 1.5-GHz band transmitted signal and the 800-MHz band transmitted signal are outputted is performed by a controlling circuit not shown.

The transmitting circuit section 1 comprises an upconverter 7*a*, a filter 8*a*, a variable gain amplifier 81*a*, a power amplifier 9*a*, an isolator 11, a filter 12, an upconverter 7*b*, a variable gain amplifier 81*b*, a filter 8*b*, a power amplifier 9*b*, and a directional coupler 13, which are similar to those explained in section "Related Art of the Invention".

The receiving circuit section 2 is a circuit that converts the signal, inputted from the composite filter 18, into the intermediate frequency signal to output the signal to the base band section 3.

The receiving circuit section 2 comprises a low-noise amplifier 19*a*, a filter 20*a*, a mixer 21*a*, a low-noise amplifier 19*b*, a filter 20*b*, a mixer 21*b*, and a filter 22, which are similar to those explained in section "Prior art".

The 1.5-GHz band-receiving SAW filter 17 is a surface acoustic wave filter that passes the 1.5-GHz band signal received, and attenuates a signal except the 1.5-GHz band signal that is used for reception.

The composite filter 18 is a multi-input/single-output filter having two inputs and one output.

The composite filter 18 comprises a dielectric filter 14, a D-band-receiving SAW filter 15, and an A-band-receiving SAW filter 16.

The dielectric filter 14 is a dielectric coaxial filter that passes a signal in the D band 23, and attenuates a signal in the D band 28.

The D-band-receiving SAW filter 15 is a surface acoustic wave filter that passes a signal in the D band 23 and attenuates a signal except the D band 23. Moreover, the D-band-receiving SAW filter 15 is a surface acoustic wave filter whose output impedance becomes infinite (open) at a frequency in the A-band 25.

The A-band-receiving SAW filter 16 is a surface acoustic wave filter that passes a signal in the A-band 25 and attenuates a signal except the A-band 25. Moreover, the A-band-receiving SAW filter 16 is a surface acoustic wave filter whose output impedance becomes infinite (open) at a frequency in the D band 23.

Figure 3:
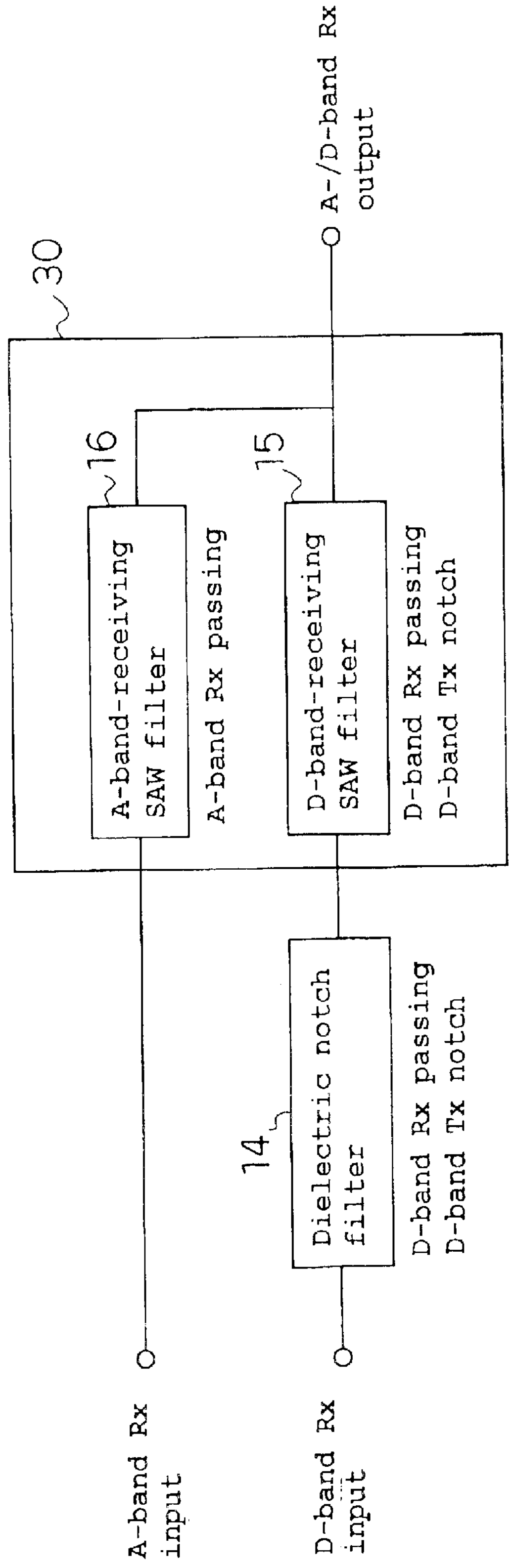
FIG. 3 is a block diagram showing the detailed configuration of the composite filter in the first embodiment of the present invention.

FIG. 3 shows the further detailed configuration of the composite filter 18. In FIG. 3, the D-band-receiving SAW filter 15 and A-band-receiving SAW filter 16 are formed on the same piezoelectric substrate 30. That is, the D-band-receiving SAW filter 15 and A-band-receiving SAW filter 16 are formed as a dual input/single-output surface acoustic wave filter. In this manner, the composite filter 18 according to this embodiment differs from the conventional composite filter 33 not to provide the switch 32 for output synthesis. An output of the D-band-receiving SAW filter 15 and an output of the A-band-receiving SAW filter 16 are connected directly.

With returning to FIG. 1, the switch 4 is means of switching which of inputs of the composite filter 18 receives a signal received by the antennas 5 and 6, and switching which of outputs of the transmitting circuit section 1 is inputted into the antennas 5 and 6.

Figure 5:
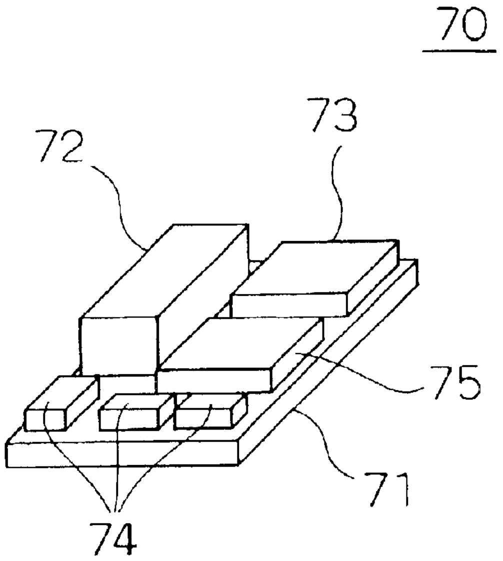
FIG. 5 is a perspective view showing the configuration of a composite filter module in the first embodiment of the present invention.

The composite filter 18 and 1.5-GHz band SAW filter 73 are constituted as a composite filter module. FIG. 5 shows the configuration of such a composite filter module 70. The composite filter module 70 has the structure that a dielectric coaxial resonator 72, the 1.5-GHz band SAW filter 73, chip LC components 74, and an A-band/D-band dual band SAW filter 75 are mounted on a printed circuit board 71, and is mounted on a radio circuit board of the portable telephone terminal 40.

The dielectric coaxial resonator 72 corresponds to the dielectric notch filter 14 in FIG. 1. The A-band/D-band dual band SAW filter 75 holds also functions of the A-band-receiving SAW filter 16 and D-band-receiving SAW filter 17 in FIG. 1. That is, the dual band SAW filter 75 corresponds to a portion of the surface acoustic wave filter that is constituted of the piezoelectric substrate 30, A-band-receiving SAW filter 16, and D-band-receiving SAW filter 17, and the like that are shown in FIG. 3.

In addition, the D band 23 in this embodiment is an example of a first frequency band in the present invention, the A-band 25 in this embodiment is an example of a second frequency band in the present invention, and the D band 28 in this embodiment is an example of a third frequency band in the present invention. Furthermore, the D-band-receiving SAW filter 15 in this embodiment is an example of a first surface acoustic wave filter in the present invention, and the A-band-receiving SAW filter 16 in this embodiment is an example of a second surface acoustic wave filter in the present invention.

Next, the operation of this embodiment like this will be explained.

First of all, the operation at the time of the portable phone terminal 60 communicating by a communication system using the D band 23 and D band 28 will be explained.

In this case, as described in section "Prior art", the portable phone terminal 60 performs simultaneous transmission and reception that the portable phone terminal 60 transmits a transmitted wave and receives a received wave at the same time.

That is, the intermediate frequency signal outputted from the base band section 3 is inputted into the upconverter **7*a* of the transmitting circuit section 1. The upconverter 7*a* converts the inputted intermediate frequency signal into a transmission frequency signal, that is, a signal at a frequency included in the D band 28. This transmission frequency signal is amplified in such a gain that the transmission frequency signal may become a transmission output determined by the variable gain amplifier 81*a*, is decreased by the filter 8*a* for its unnecessary frequency component, and is amplified to a transmission output by the power amplifier 9*a*. The amplified signal passes the isolator 11, is decreased by the filter 12 for a strain component, and is inputted into the switch 4**.

The switch 4 is switched so that an output signal of the filter 12 may be inputted into the antenna 5 or 6. Hence, the signal outputted from the filter 12 is inputted into the antenna 5 or antenna 6, and is radiated as an electric wave from the antenna 5 or antenna 6 in the air.

On the other hand, the portable phone terminal 60 performs also receiving operation at the same time as the above-mentioned transmitting operation. That is, the electric wave transmitted from a base station is converted into an electrical signal by the antenna 5 or antenna 6, and is outputted into the switch 4. The switch 4 switches under the control of a controlling circuit, not shown, which of the 1.5-GHz band SAW filter 17, A-band-receiving SAW filter 16, and dielectric filter 14 receives the electrical signal outputted from the antenna 5 or antenna 6. Now, since this system communicates by the communication system using the D band 23 and D band 28, the switch 4 is switched so that this electrical signal may be outputted as a received signal to the dielectric filter 14. Hence, the received signal is outputted to the dielectric filter 14.

Moreover, since simultaneous transmission and reception are performed, the transmitted signal outputted from the transmitting circuit section 1 is outputted to the antennas 5 and 6 via the switch 4 and is radiated in the air, and simultaneously, a part of the transmitted signal is inputted from the switch 4 to the dielectric filter 14.

A transmitted signal inputted into this dielectric filter 14 is high-power in comparison with the received signal. Hence, the dielectric filter 14 that is strong in a large amount of power is used instead of a SAW filter as a filter for the D band 23. That is, when the SAW filter is used instead of the dielectric filter 14, the SAW filter is weaker to a large amount of power than the dielectric filter 14, and hence, the SAW filter may be damaged or may malfunction. In this manner, in the case of the communication system that uses the D band 23 and D band 28, the received signal and transmitted signal are inputted at the same time from the switch 4 to the dielectric filter 14 of the composite filter 18. Then, the dielectric filter 14 passes the received signal included in the D band 23, and attenuates the transmitted signal included in the D band 28.

Next, the signal outputted from the dielectric filter 14 is inputted into the D-band-receiving SAW filter 15. The D-band-receiving SAW filter 15 passes a signal included in the D band 23 in the inputted signal, and attenuates a signal with a frequency not included in the D band 23. In addition, apparently from FIG. 2, there is a frequency interval of 112 MHz (=940−828) or more between a frequency included in the D band 23 and a frequency included in the D band 28. In this manner, when a frequency interval between a frequency included in the D band 23 and a frequency included in the D band 28 is apart equally to or more than a predetermined frequency interval, it is possible that the dielectric filter 14 passes a signal in the D band 23 and attenuates a signal in the D band 28.

Moreover, since the output impedance of the A-band-receiving SAW filter 16 becomes infinite (open) at a frequency in the D band 23, the A-band-receiving SAW filter 16 can block a signal outputted from the D-band-receiving SAW filter 15 from flowing into an input terminal of the A-band-receiving SAW filter 16.

Hence, the signal outputted from the D-band-receiving SAW filter 15 is inputted directly to the low-noise amplifier 19*a* without the switch etc. for output synthesis.

The signal inputted into the low-noise amplifier 19*a* is converted into an intermediate frequency signal by the receiving circuit section 2, and is outputted into the base band section 3.

Hence, even if a dielectric filter whose attenuation is smaller than that of the dielectric filter 30 of the composite filter 33, which is conventional technology, is used as dielectric filter 14, it is possible to obtain an attenuation characteristic equal to or more than that of the composite filter 33 that is conventional technology. This is because the D-band-receiving SAW filter 15 in the downstream stage of the dielectric filter 14 further attenuates a signal at a frequency except the D band 23. Moreover, since an attenuation of the dielectric filter 14 is fewer than that of the dielectric filter 30 that is conventional technology, it is possible to make the dielectric filter 14 smaller than the dielectric filter 30 of the conventional composite filter 33. Hence, it is possible not only to make the composite filter 18 in this embodiment smaller than the composite filter 33 that is conventional technology, but also to make the composite filter 18 in this embodiment have an attenuation characteristic equal to or more than that of the composite filter 33 that is conventional technology.

On the contrary, when a dielectric filter that is similar to the dielectric filter 30 of the composite filter 33 that is conventional technology is used as the dielectric filter 14, the D-band-receiving SAW filter 15 in the downstream stage of the dielectric filter 14 further attenuates a signal at a frequency except the D band 23. Hence, it is possible not only to make an attenuation except a pass band larger than the composite filter 33 that is conventional technology, but also to make the composite filter 18 have a steep attenuation characteristic in the vicinity of a pass band.

Moreover, the transmitted signal outputted from the switch 4 is first inputted into the dielectric filter 14. Then, after the dielectric filter 14 attenuates the high-power transmitted signal to a low-power transmitted signal, the low-power transmitted signal is inputted into the D-band-receiving SAW filter 15. Hence, it is possible to make the D-band-receiving SAW filter 15 not damaged and not malfunction since the low-power signal is inputted to the SAW filter 15.

Then, since the SAW filter 15 attenuates a signal steeply in the vicinity of a pass band in comparison with the dielectric filter 14, it is possible to attenuate a noise component and the like at a frequency except the D band 23 in the vicinity of the D band 23 more excellently than conventional technology.

The low-noise amplifier 19*a* amplifies the signal inputted from the D-band-receiving SAW filter 15. The amplified signal is decreased for an unnecessary frequency component by the filter 20*a*, and is converted into an intermediate frequency signal by the mixer 21*a*. The filter 22 decreases an unnecessary frequency component included in the signal converted into the intermediate frequency to output the signal to the base band section 3.

Next, the operation at the time of the portable phone terminal 60 communicating by a communication system using the A-band 25 and A-band 27 will be explained.

In this case, when the portable phone terminal 60 outputs a transmitted wave, the receiving circuit 2 does not output the intermediate frequency signal to the base band section 3. That is, the receiving operation is stopped. Then, when the receiving circuit 2 inputs the received signal and converts the signal into an intermediate frequency signal to output the signal to the base band section 3, the transmitting circuit 1 does not output the transmitted signal. In this manner, the portable phone terminal 60 switches the transmitting and receiving operation in time-sharing.

That is, when the transmitting operation is performed, the transmitting circuit section 1 outputs the transmission signal to the switch 4 similarly to the case of the above-mentioned D band. The switch 4 is switched under the control of a controlling circuit, not shown, so that the inputted signal may be inputted to the antenna 5 or antenna 6. Hence, the signal inputted from the transmitting circuit section 1 to the switch 4 is radiated from the antenna 5 or antenna 6 as an electric wave in the air.

Moreover, at the time of receiving operation, the switch 4 is switched by a controlling circuit, not shown, so that a received signal converted into an electrical signal by the antenna 5 or antenna 6 may be inputted into the A-band-receiving SAW filter 15. Hence, the received signal that is converted into the electrical signal by the antenna 5 or antenna 6 is inputted into the A-band-receiving SAW filter 16 through the switch 4. In this case, since the transmitting circuit section 1 stops its operation, that is, does not output a transmitted signal, the transmitted signal is not inputted into the A-band-receiving SAW filter 16. The A-band-receiving SAW filter 16 passes a received signal in the A-band 25, and attenuates a signal, having a frequency except the A-band 25, as a noise component.

Since the output impedance of the D-band-receiving SAW filter 15 becomes infinite (open) at a frequency in the A-band 25, the D-band-receiving SAW filter 15 can block a signal outputted from the A-band-receiving SAW filter 16 from flowing into an input terminal of the D-band-receiving SAW filter 15.

Hence, the signal outputted from the A-band-receiving SAW filter 16 is inputted directly to the low-noise amplifier 19*a* without the switch etc. for output synthesis.

The signal inputted into the low-noise amplifier 19*a* is converted into an intermediate frequency signal by the receiving circuit section 2 similarly to the case of the communication system that uses the D band 23 and D band 28, and is outputted to the base band section 3.

In this manner, since the output impedance of the D-band-receiving SAW filter 15 becomes infinite (open) at a frequency in the A-band 25, the D-band-receiving SAW filter 15 can block a signal outputted from the A-band-receiving SAW filter 25 from flowing into an input terminal of the D-band-receiving SAW filter 15. Moreover, since the output impedance of the A-band-receiving SAW filter 16 becomes infinite (open) at a frequency in the D band 23, the A-band-receiving SAW filter 16 can block a signal outputted from the D-band-receiving SAW filter 15 from flowing into an input terminal of the A-band-receiving SAW filter 16.

In this manner, in the composite filter 18 in this embodiment, the D-band-receiving SAW filter 15 and A-band-receiving SAW filter 16 are connected together in an input side of the low-noise amplifier 19*a*. Then, both of the SAW filters have equal output impedance and can make a partner's output impedance infinite (open) in a pass band each other. Hence, it is possible to connect them directly to an input terminal of the low-noise amplifier 19*a* without a switch for output synthesis as used in conventional technology. In this manner, it becomes possible to synthesize outputs without a switch by cascade-connecting the dielectric filter 14 and D-band-receiving SAW filter 15. Then, it is possible to miniaturize the composite filter 18 according to this embodiment to the extent obtained by deletion of the switch. Moreover, since the composite filter 18 according to this embodiment doesn't use a switch, there is no loss when a signal passes the switch, and hence, it is possible to reduce the loss of the composite filter 18 to that extent.

In addition, since the operation of the case that the portable phone terminal 60 communicates by the communication system that uses the 1.5-GHz band is similar to that in conventional technology, detailed explanation of them will be omitted.

Moreover, in general, it is possible to easily adjust a dielectric filter for an attenuating frequency etc. by performing the processing of cutting a dielectric filter after production, and the like. On the other hand, it is difficult to adjust the SAW filter for a filter characteristic after production.

Hence, even after the production of the composite filter 18, by adjusting the attenuating frequency etc. of the dielectric filter 14, it is possible to adjust the composite filter 18 so that an attenuation obtained by combining the dielectric filter 14 and SAW filter 15 may become larger.

In this manner, the filter 12 of the transmitting circuit section 1, directional coupler 13, switch 4, composite filter 18, and 1.5-GHz band SAW filter 17 function as an antenna duplexer. Hence, it is possible to realize a small, highly-attenuated, and low-loss antenna duplexer by using the composite filter 18 according to this embodiment in a part of the antenna duplexer.

Figure 4A:
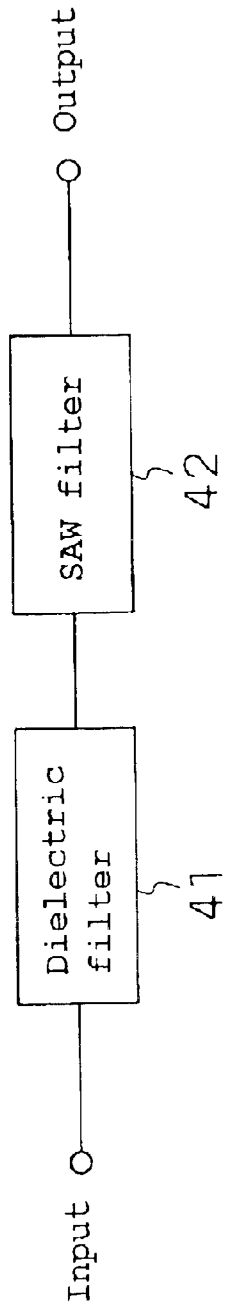
FIG. 4A is a block diagram showing the configuration of the single-input/single-output composite filter in the first embodiment of the present invention.

Moreover, FIG. 4A shows a single-input/single-output composite filter. In the composite filter shown in FIG. 4A, a dielectric filter 41 and an SAW filter 42 are cascade-connected. An input signal is inputted into a terminal of the dielectric filter 41, and an output signal is outputted from another terminal of the SAW filter 42.

Doing this makes it possible to realize a filter that not only can input a high-power signal such as a transmitted signal into its input side, but also attenuates a signal steeply in the vicinity of a pass band and has a large attenuation.

Figure 4B:
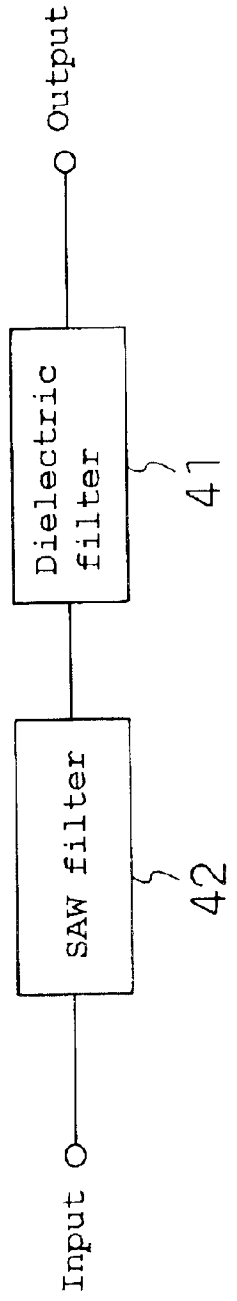
FIG. 4B is a block diagram showing the configuration of the single-input/single-output composite filter in the first embodiment of the present invention.

Moreover, FIG. 4B shows another single-input/single-output composite filter. In the composite filter shown in FIG. 4B, an SAW filter 42 and a dielectric filter 41 are cascade-connected. An input signal is inputted into a terminal of the SAW filter 42, and an output signal is outputted from another terminal of the dielectric filter 41.

Doing this makes it possible to realize a filter that attenuates a signal steeply in the vicinity of a pass band and has a large attenuation.

Moreover, in both cases of the composite filter shown in FIG. 4A and the composite filter shown in FIG. 4B, it is possible to fine-tune a characteristic of each composite filter by giving the processing such as cutting the dielectric filter 41 after the production of each composite filter.

Here, a pass characteristic of each filter and a pass characteristic of the composite filter will be described in detail.

Figure 8:
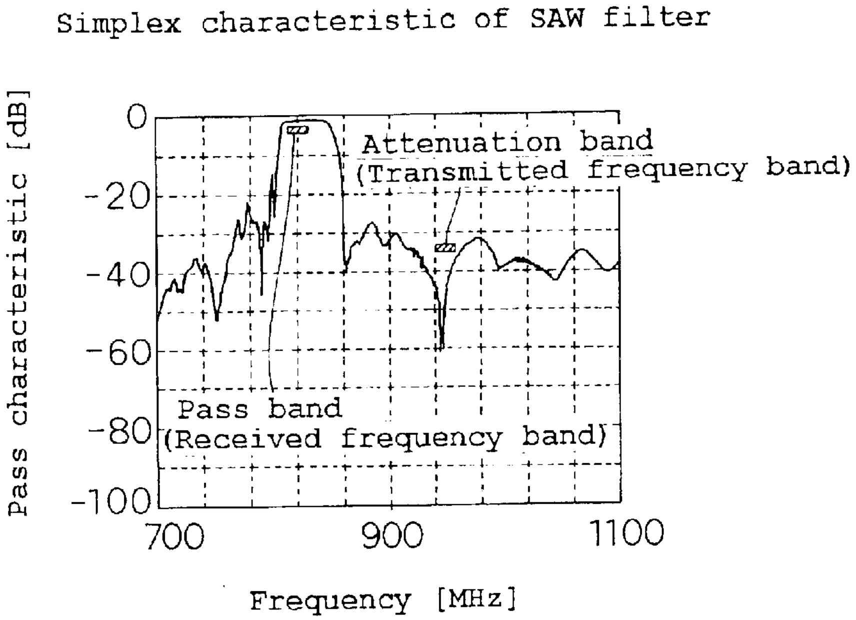
FIG. 8 is a graph showing a pass characteristic of a SAW filter by itself in the first embodiment of the present invention.

FIG. 8 is a graph showing a pass characteristic of a SAW filter by itself. The SAW filter has a pass characteristic suitable for passing a pass band (receiving-D band: 810 MHz to 828 MHz) and attenuating a receiving-A band (870 MHz to 885 MHz) that is adjacent. Nevertheless, since an attenuation is about 30 dB even at a frequency enough apart from the pass band, which is far from an attenuation required in a transmitting frequency band (transmitting-D band: 940 MHz to 958 MHz), for example, 55 to 60 dB. Though an attenuation pole fortunately occurs in a transmitting frequency band also in the pass characteristic of the SAW filter, bandwidth is narrow and the attenuation does not reach the above-mentioned value.

Figure 9:
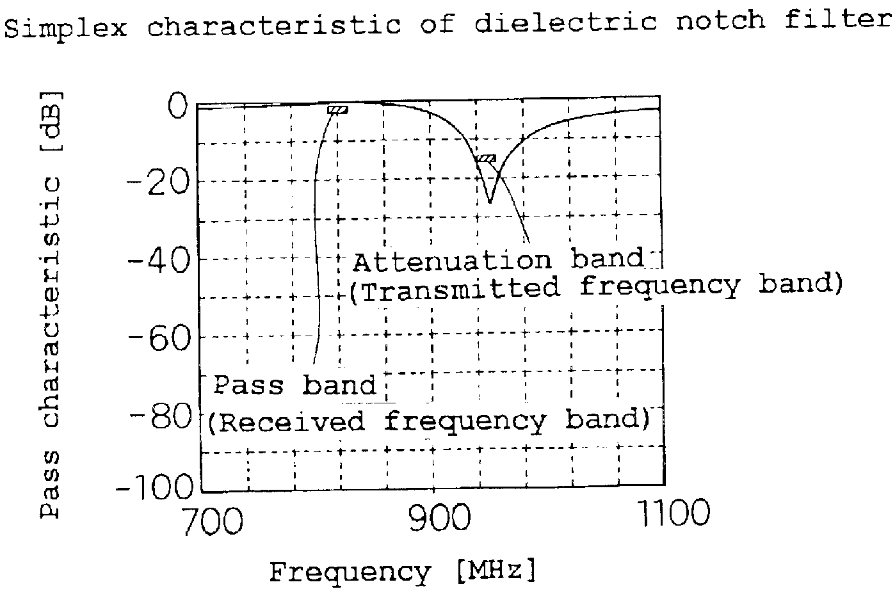
FIG. 9 is a graph showing a pass characteristic of a dielectric notch filter by itself in the first embodiment of the present invention.

FIG. 9 is a graph showing a pass characteristic of a dielectric notch filter. Since having very small insertion loss in a pass band (receiving-D band: 810 MHz to 828 MHz) the dielectric notch filter is suitable for the cascade-connection of filters. However, since this is not suitable for securing a large attenuation in the vicinity of the pass band, it is not possible to attenuate a receiving-A band (870 MHz to 885 MHz) by this filter alone. On the other hand, the dielectric notch filter can secure an attenuation of 15 to 20 dB in a wide band, which can cover the entire transmitting frequency band of 18 MHz, in the transmitting-D band apart 112 MHz or more. In the dielectric notch filter, it is possible to easily raise or lower an attenuating frequency by trimming the dielectric ceramic or an electrode of a dielectric resonator. Hence, it is possible to easily obtain an excellent characteristic with performing simple adjustment by fine-tuning the attenuation pole frequency of the dielectric notch filter also for a slight shift of the attenuation pole frequency of the above-mentioned SAW filter.

Figure 10:
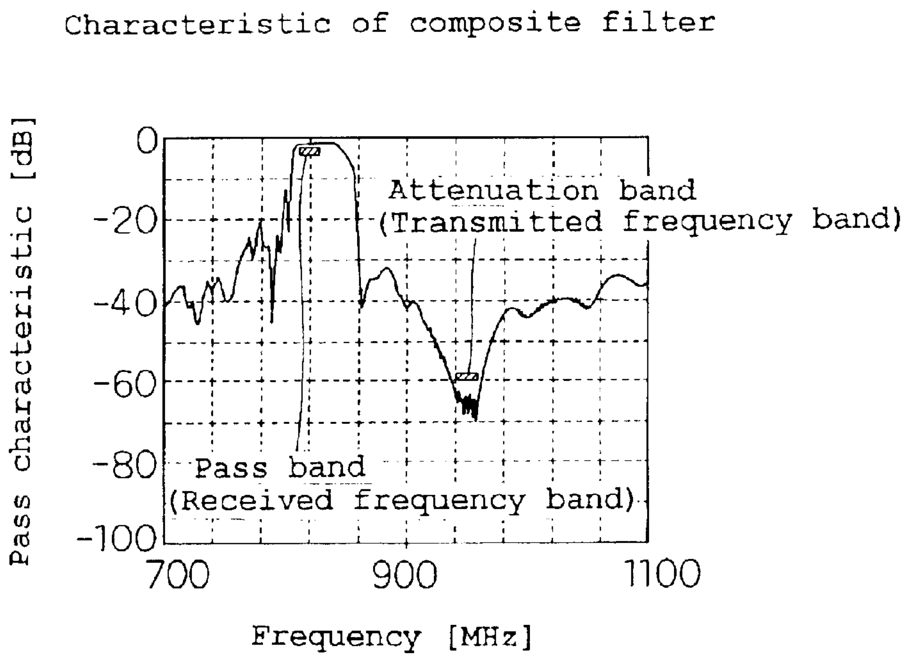
FIG. 10 shows a pass characteristic of a composite filter configured by cascade-connecting the dielectric notch filter and SAW filter in the first embodiment of the present invention.

FIG. 10 shows a pass characteristic of a composite filter configured by cascade-connecting the dielectric notch filter and SAW filter. Well combining features of two filters mentioned above was made it possible to achieve the low loss of 2 dB or less in the pass band, an attenuation of 30 dB or more in the receiving-A band in the vicinity of the pass band, and a large attenuation of 55 to 60 dB or more over a frequency band of 18 MHz in the transmitting frequency band.

Such a characteristic cannot be obtained by a SAW filter alone, and cannot be also obtained by a dielectric filter alone. This becomes possible for the first time by a composite filter that has the configuration of the present invention that both filters are combined.

In addition, though the composite filter 18 is explained in this embodiment assuming that the composite filter 18 is a two-input/one-output type, the composite filter 18 is not limited to this. It is acceptable to further install a plurality of receiving SAW filters, which pass reception bands that are different from each other, in parallel to the A-band-receiving SAW filter 16. In this case, the signal input into the plurality of these receiving SAW filters is performed by switching filters by the switch 4, and outputs of the plurality of these receiving SAW filters are connected to the output of the A-band-receiving SAW filter 16. Then, it is made that these SAW filters including the D-band-receiving SAW filter 15 and A-band-receiving SAW filter 16 can block signals passing through and being outputted by other partners of SAW filters. In this manner, even in the case of a multi-input/single-output composite filter, it is possible to obtain effects equal to those of this embodiment.

Figure 11:
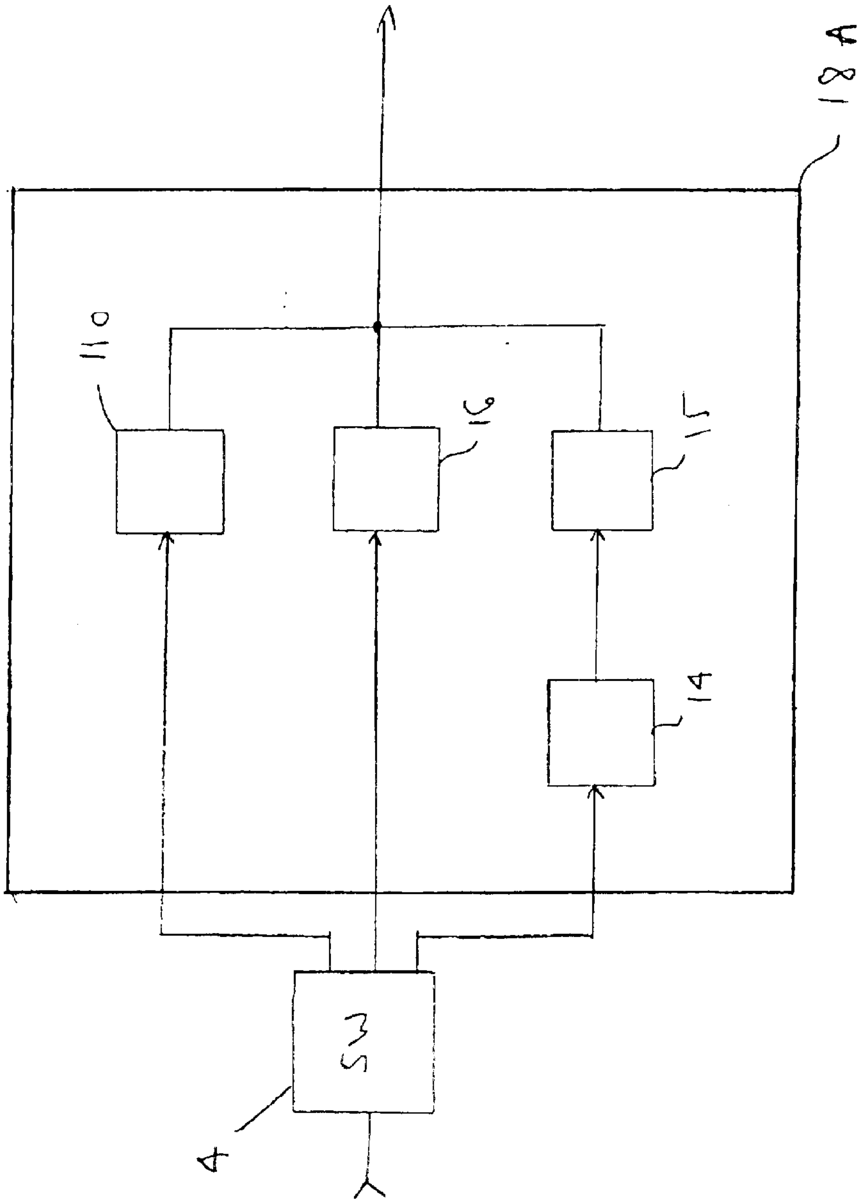
FIG. 11 is a block diagram showing the configuration of a composite filter in another embodiment of the present invention.

FIG. 11 shows composite filter 18A including receiving SAW filter 110, which is disposed in parallel with A-band-receiving SAW filter 16 and D-band-receiving SAW filter 15. Although not identical, composite filter 18A includes components that are the same as components of composite filter 18 shown in FIG. 1 and are connected to switch 4.

Moreover, it is explained in this embodiment that the dielectric filter 14 is a dielectric coaxial filter that passes a signal in the D band 23 and attenuates a signal in the D band 28, and the D-band-receiving SAW filter 15 is a surface acoustic wave filter that passes a signal in the D band 23 and attenuates a signal except the D band 23. Nevertheless, these are not limited to them. It is also good that the dielectric filter 14 is a dielectric coaxial filter that passes a signal in the D band 23 and C band 24 and attenuates a signal in the D band 28, and the D-band-receiving SAW filter 15 is a surface acoustic wave filter that passes a signal in the D band 23 and C band 24 and attenuates a signal except the D band 23 and C band 24. Nevertheless, the C band 24 is a frequency band for reception that is used in a communication system using the C band 24 for reception and using the C band 26 for transmission. Then, this communication system is made not to perform simultaneous transmission and reception.

Figure 6:
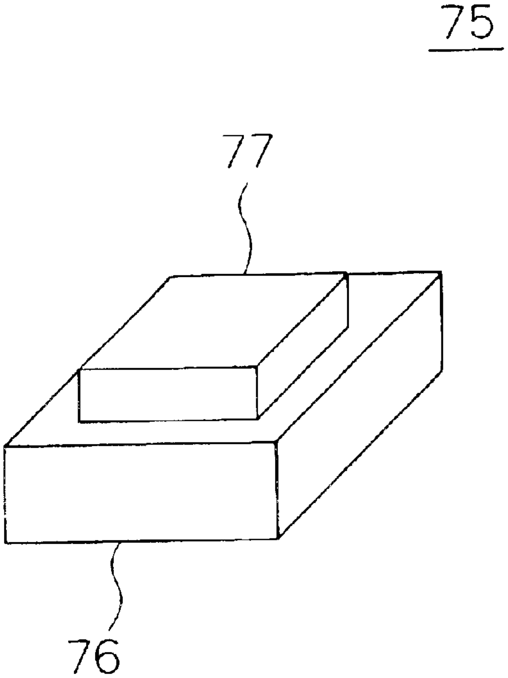
FIG. 6 is a perspective view of the composite filter module, which has layered structure, in the first embodiment of the present invention.
Figure 7:
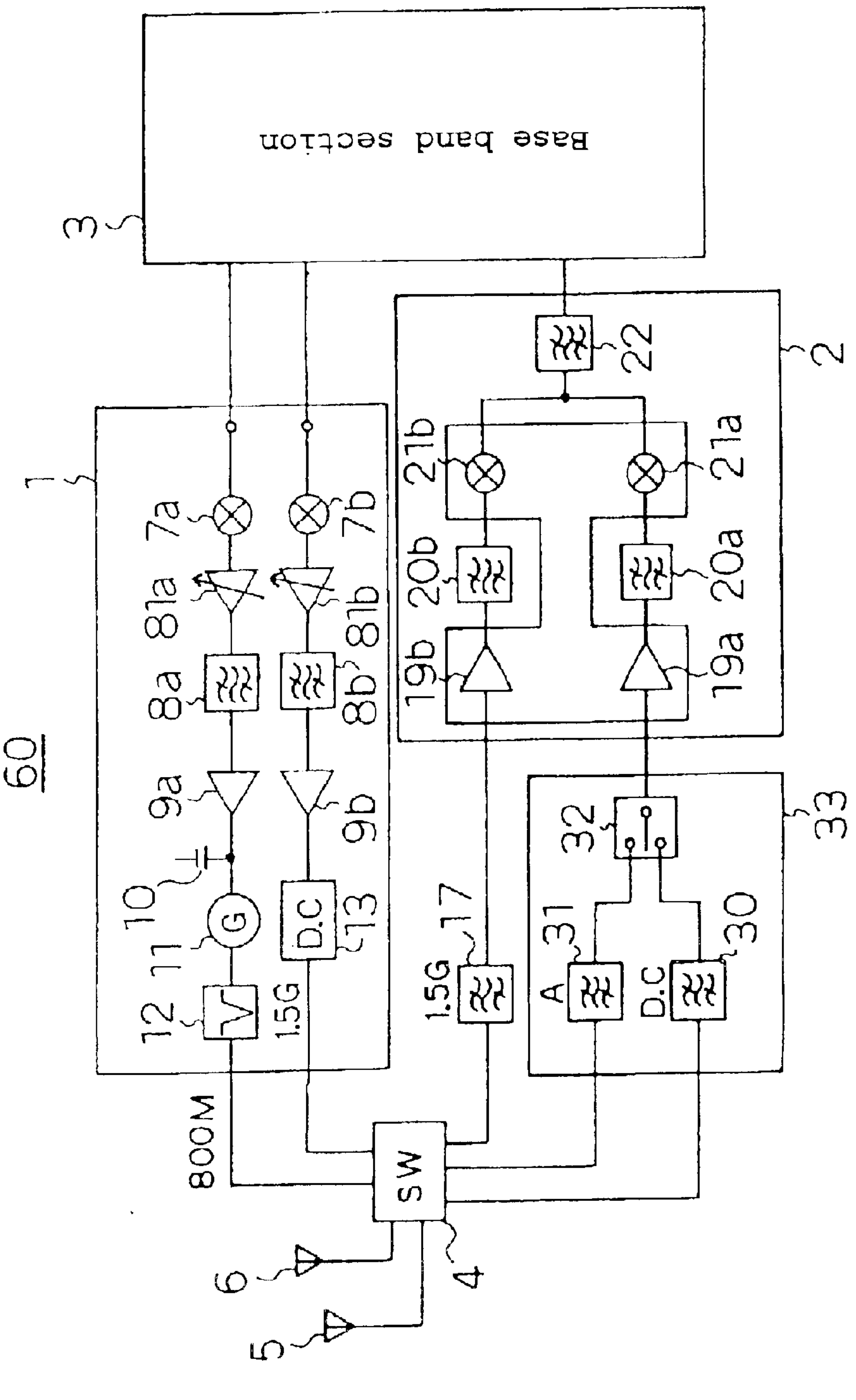
Fig. 7 PRIOR ART
FIG. 7 is a block diagram showing the configuration of a portable phone terminal using a conventional composite filter.

Moreover, though the 1.5-GHz band SAW filter and composite filter 18 are integrated into one composite filter module 70 in this embodiment, these are not limited to this configuration. As shown in FIG. 6, it is also possible to configure them as a composite filter module 75 that has layered structure.

That is, the composite filter module 75 shown in FIG. 6 has the configuration that an SAW filter 77 is mounted in a state of a package or a bare chip on a dielectric layered notch filter 76. In this manner, it is possible to use the composite filter module 75, which has the layered structure shown in FIG. 6, instead of the composite filter module 70 shown in FIG. 5.

In addition, though an example of a module formed by integrating a dielectric filter and an SAW filter is explained in this embodiment, the configuration of the present invention is not limited to this, but everything is included so long as it can achieve a pass characteristic at which the present invention aims. For example, such modification that a dielectric resonating section and a SAW filter section are separately configured is naturally in a scope of the present invention.

As apparently from the above explanation, the present invention can provide a composite filter, an antenna duplexer, and a communication apparatus that are small in size.

In addition, the present invention can provide a composite filter, an antenna duplexer, and a communication apparatus that have low loss in a pass band.

Furthermore, the present invention can provide a composite filter, an antenna duplexer, and a communication apparatus that each have a high attenuation except a pass band.

Moreover, the present invention can provide a composite filter an attenuation of which is large in magnitude even if a high-power signal is inputted, and which has a steep attenuation characteristic in the vicinity of a pass band.

In addition, the present invention can provide a composite filter, an antenna duplexer, and a communication apparatus that each steeply attenuate a signal in the vicinity of a pass band and have a large attenuation.

What is claimed is:

1. A composite filter, comprising:

a dielectric notch filter; and a first surface acoustic wave filter, wherein an attenuation band of the dielectric notch filter and an attenuation band of the first surface acoustic wave filter have at least a common band portion; and the dielectric notch filter and the first surface acoustic wave filter are connected in cascade;

wherein an input signal is inputted into a terminal of the dielectric notch filter;

another terminal of the dielectric notch filter is connected to a terminal of the first surface acoustic wave filter; and an output signal is outputted from another terminal of the first surface acoustic wave filter;

a terminal of a second surface acoustic wave filter receives an input signal, and another terminal of the second surface acoustic wave filter is connected to the other terminal of the first surface acoustic wave filter, wherein a terminal of the dielectric notch filter receives a signal in a first frequency band and a signal in a third frequency band that is a frequency band not including a common portion to the first frequency band;

a terminal of the second surface acoustic wave filter receives a signal in a second frequency band that is a frequency band not having a common portion to the first frequency band and the third frequency band, and is a frequency band between the first frequency band and the third frequency band;

both of a pass band of the dielectric notch filter and a pass band of the first surface acoustic wave filter include the first frequency band;

a pass band of the second surface acoustic wave filter includes the second frequency band;

both of an attenuation band of the dielectric notch filter and an attenuation band of the first surface acoustic wave filter include the third frequency band;

a frequency interval between a frequency included in the first frequency band and a frequency included in the third frequency band is apart equally to or more than a predetermined frequency interval; and the first surface acoustic wave filter can block at least a signal in the second frequency band.

2. The composite filter according to claim 1, wherein the second surface acoustic wave filter can block at least a signal in the first frequency band.

3. The composite filter according to claim 2, comprising:

a third filter one terminal of which receives an input signal, and another terminal of which is connected to another terminal of the first surface acoustic wave filter;

wherein a signal in frequency bands that do not have common portions to the first frequency band and the third frequency band and do not have common portions to each other is inputted into one terminal of the third surface acoustic wave filter;

wherein a pass band of the third surface acoustic wave filter includes a frequency band including the signal inputted; and wherein the third surface acoustic wave filter can block at least a signal in the first frequency band, a signal in the second frequency band.

4. The composite filter according to any one of claims 1 to 3, wherein an attenuation frequency of the dielectric notch filter is adjusted so as to obtain an attenuation equal to or more than a predetermined amount by combining an attenuation of the dielectric notch filter with an attenuation of the first surface acoustic wave filter.

5. The composite filter according to any one of claims 1 to 3, wherein which of one terminal of the dielectric notch filter and the surface acoustic wave filter receives a signal is switched by a switch.

6. An antenna duplexer comprising:

the composite filter according to claim 5;

the switch connected to an antenna; and a transmission filter connected to the switch, wherein the first frequency band is a frequency band for reception when simultaneous transmission and reception is performed;

wherein the third frequency band is a frequency band for transmission when the simultaneous transmission and reception is performed; and wherein the switch not only electrically connects the antenna to one terminal of the dielectric notch filter, but also electrically connects an output of the transmission filter to the antenna when the simultaneous transmission and reception is performed.

7. A communication apparatus comprising:

the antenna duplexer according to claim 9;

a transmitting circuit outputting a transmitted signal to the transmission filter; and a receiving circuit receiving a received signal outputted from the composite filter of the antenna duplexer.

8. A composite filter comprising:

a dielectric notch filter; and a first surface acoustic wave filter, wherein an attenuation band of the dielectric notch filter and an attenuation band of the first surface acoustic wave filter have at least a common band portion; and the dielectric notch filter and the first surface acoustic wave filter are connected in cascade;

wherein an input signal is inputted into a terminal of the dielectric notch filter;

another terminal of the dielectric notch filter is connected to a terminal of the first surface acoustic wave filter; and an output signal is outputted from an other terminal of the first surface acoustic wave filter;

a terminal of a second surface acoustic wave filter receives an input signal, and another terminal of the second surface acoustic wave filter is connected to the other terminal of the first surface acoustic wave filter;

wherein a pass band of the dielectric notch filter and a pass band of the first surface acoustic wave filter include a first frequency band, a pass band of the second surface acoustic wave filter includes a second frequency band;

an attenuation band of the dielectric notch filter and an attenuation band of the first surface acoustic wave filter include a third frequency band; and the second frequency band is between the first and the third frequency bands.

9. A composite filter comprising:

a dielectric notch filter; and a first surface acoustic wave filter, wherein an attenuation band of the dielectric notch filter and an attenuation band of the first surface acoustic wave filter have at least a common band portion; and the dielectric notch filter and the first surface acoustic wave filter are connected in cascade;

wherein an input signal is inputted into a terminal of the dielectric notch filter;

another terminal of the dielectric notch filter is connected to a terminal of the first surface acoustic wave filter; and an output signal is outputted from an other terminal of the first surface acoustic wave filter;

a terminal of a second surface acoustic wave filter receives an input signal, and another terminal of the second surface acoustic wave filter is connected to the other terminal of the first surface acoustic wave filter;

wherein a pass band of the dielectric notch filter and a pass band of the first surface acoustic wave filter include a first frequency band, a pass band of the second surface acoustic wave filter includes a second frequency band;

an attenuation band of the dielectric notch filter and an attenuation band of the first surface acoustic wave filter include a third frequency band; and the first, second and third frequency bands are each different from each other.

* * * * *

UNITED STATES PATENT AND TRADEMARK OFFICE

CERTIFICATE OF CORRECTION

PATENT NO. : 6,809,611 B2
DATED : October 26, 2004
INVENTOR(S) : Ishizaki et al.

It is certified that error appears in the above-identified patent and that said Letters Patent is hereby corrected as shown below:

<u>Column 19,</u>
Line 5, "9" should read -- 6 --

Signed and Sealed this

Thirty-first Day of May, 2005

JON W. DUDAS
*Director of the United States Patent and Trademark Office*